(12) United States Patent
Ashdown et al.

(10) Patent No.: US 9,209,059 B2
(45) Date of Patent: Dec. 8, 2015

(54) METHOD AND ELETROSTATIC TRANSFER STAMP FOR TRANSFERRING SEMICONDUCTOR DICE USING ELECTROSTATIC TRANSFER PRINTING TECHNIQUES

(75) Inventors: Ian Ashdown, West Vancouver (CA); Ingo Speier, Saanichton (CA)

(73) Assignee: Cooledge Lighting, Inc., Richmond (CA)

( * ) Notice: Subject to any disclaimer, the term of this patent is extended or adjusted under 35 U.S.C. 154(b) by 1395 days.

(21) Appl. No.: 12/966,992

(22) Filed: Dec. 13, 2010

(65) Prior Publication Data

US 2012/0027557 A1 Feb. 2, 2012

Related U.S. Application Data

(60) Provisional application No. 61/287,445, filed on Dec. 17, 2009.

(51) Int. Cl.
*H01L 21/683* (2006.01)
*H01L 23/00* (2006.01)
(Continued)

(52) U.S. Cl.
CPC ........ *H01L 21/6833* (2013.01); *H01L 21/6835* (2013.01); *H01L 24/75* (2013.01); *H01L 24/83* (2013.01); *H01L 24/95* (2013.01); *H01L 33/005* (2013.01); *H01L 2221/68354* (2013.01); *H01L 2221/68381* (2013.01); *H01L 2224/838* (2013.01); *H01L 2224/83192* (2013.01); *H01L 2224/95145* (2013.01); *H01L 2924/0103* (2013.01); *H01L 2924/014* (2013.01); *H01L 2924/0105* (2013.01); *H01L 2924/0106* (2013.01); *H01L 2924/01013* (2013.01); *H01L 2924/01033* (2013.01);
(Continued)

(58) Field of Classification Search
CPC ..... H01L 21/6833; H01L 24/75; H01L 24/95; H01L 33/005; H01L 21/6835
USPC ..................... 414/800, 941; 901/40
See application file for complete search history.

(56) References Cited

U.S. PATENT DOCUMENTS

| | | | |
|---|---|---|---|
| 4,948,692 A | 8/1990 | Higashimura | |
| 5,048,178 A | 9/1991 | Bindra | |

(Continued)

FOREIGN PATENT DOCUMENTS

| | | |
|---|---|---|
| EP | 1653523 | 5/2006 |
| JP | 2271550 | 11/1990 |
| WO | 2008047144 | 4/2008 |

OTHER PUBLICATIONS

International Search Report filed in co-pending PCT application No. PCT/CA2010001949 filed on Dec. 14, 2010.

(Continued)

*Primary Examiner* — Saul Rodriguez
*Assistant Examiner* — Lynn Schwenning
(74) *Attorney, Agent, or Firm* — Morgan, Lewis & Bockius LLP

(57) ABSTRACT

A transfer stamp that can be charged with a spatial pattern of electrostatic charge for picking up selected semiconductor dice from a host substrate and transferring them to a target substrate. The stamp may be bulk charged and then selectively discharged using irradiation through a patterned mask. The technique may also be used to electrostatically transfer selected semiconductor dice from a host substrate to a target substrate.

7 Claims, 2 Drawing Sheets

(51) Int. Cl.
  *H01L 33/00* (2010.01)
  *H05K 3/30* (2006.01)
(52) U.S. Cl.
  CPC ............... *H01L 2924/01049* (2013.01); *H01L 2924/01058* (2013.01); *H01L 2924/01061* (2013.01); *H01L 2924/01075* (2013.01); *H01L 2924/14* (2013.01); *H01L 2924/19041* (2013.01); *H01L 2924/3025* (2013.01); *H05K 3/303* (2013.01)

(56) References Cited

U.S. PATENT DOCUMENTS

| | | | |
|---|---|---|---|
| 5,667,884 A | 9/1997 | Bolger | |
| 7,172,910 B2* | 2/2007 | Hadley et al. | 438/28 |
| 7,256,483 B2 | 8/2007 | Epler et al. | |
| 7,270,931 B2* | 9/2007 | Angelopoulos et al. | 430/270.1 |
| 7,407,081 B2* | 8/2008 | Rice et al. | 228/8 |
| 7,488,621 B2 | 2/2009 | Epler et al. | |
| 7,557,367 B2 | 7/2009 | Rogers | |
| 2004/0128829 A1 | 7/2004 | Kimura | |
| 2005/0232728 A1* | 10/2005 | Rice et al. | 414/217 |
| 2005/0247950 A1* | 11/2005 | Nakamura et al. | 257/98 |
| 2005/0252787 A1 | 11/2005 | Wehrspohn | |
| 2006/0223225 A1* | 10/2006 | Arneson et al. | 438/106 |
| 2007/0032089 A1* | 2/2007 | Nuzzo et al. | 438/725 |
| 2009/0123257 A1* | 5/2009 | Zin et al. | 414/222.02 |

OTHER PUBLICATIONS

International Search Report and Written Opinion mailed Jun. 2, 2011 for International Application No. PCT/CA2011/050006 (7 pages).

* cited by examiner

METHOD AND ELETROSTATIC TRANSFER STAMP FOR TRANSFERRING SEMICONDUCTOR DICE USING ELECTROSTATIC TRANSFER PRINTING TECHNIQUES

This patent application claims the benefit of U.S. provisional application No. 61/287,445 filed Dec. 17, 2009. The disclosure of said provisional application is hereby incorporated herein by reference thereto.

TECHNICAL FIELD

The subject matter of the present invention is directed generally to the manufacture of circuits with transferable semiconductor dice and, more particularly, is concerned with a method and electrostatic transfer stamp for transferring semiconductor dice from a host substrate to a target substrate using electrostatic transfer printing techniques.

BACKGROUND ART

Illumination based on semiconductor light sources, such as light-emitting diodes (LEDs), offers an efficient and long-lived alternative to fluorescent, high-intensity discharge and incandescent lamps. Many LED light sources employ high powered LEDs, which pose thermal management problems and other related problems. Another drawback with state of the art LED devices is their high initial cost.

Small semiconductor dice including those with sizes of 300 um or smaller provide numerous benefits in applications such as broad area lighting, concentrator photovoltaics and electronics. Devices of this scale cannot be transferred from a source wafer to a target substrate utilizing conventional pick and place technology. One technique is transfer printing, for example using composite patterning devices comprising a plurality of polymer layers each having selected values of mechanical properties, such as Young's Modulus and flexural rigidity; selected physical dimensions, such as thickness, surface area and relief pattern dimensions; and selected thermal properties, such as coefficients of thermal expansion and thermal conductivity; to provide high resolution patterning on a variety of substrate surfaces and surface morphologies.

There is therefore a need for an innovation whereby small semiconductor dice can be efficiently and effectively transferred from a host substrate to a target substrate.

SUMMARY OF THE INVENTION

The subject matter of the present invention is directed to such an innovation which relates to a method and electrostatic transfer stamp for transferring semiconductor dice directly from a host substrate to a target substrate using electrostatic transfer printing techniques.

In one aspect of the invention, a method is provided for transferring semiconductor dice from a host substrate to a target substrate wherein the method includes the steps of electrostatically charging regions of a selected one of a transfer stamp or a target substrate, transferring semiconductor dice from a host substrate to the electrostatically charged regions of the selected one of the transfer stamp or target substrate by the application of the electrostatic force of the charged regions to the semiconductor dice when the host substrate is positioned adjacent to the selected one of the transfer stamp or target substrate, and releasing the semiconductor dice onto the target substrate from the transfer stamp, when the selected one is the transfer stamp, by at least removing the electrostatic charge of the electrostatically charged regions or providing an adhesive force between the semiconductor dice and the target substrate that is greater than the electrostatic force between the semiconductor dice and the electrostatically charged regions.

In another aspect of the invention, a method is provided for transferring semiconductor dice from a host substrate to a target substrate wherein the method includes electrostatically charging regions of a transfer stamp, removing semiconductor dice from a host substrate using the electrostatically charged regions of the transfer stamp, and releasing the semiconductor dice from the transfer stamp onto the target substrate by at least removing the electrostatic charge of the stamp or providing an adhesive force between the semiconductor dice and the target substrate that is greater than the electrostatic force between the semiconductor dice and the transfer stamp. The transfer stamp has spaced apart mesas formed on a light-transmitting substrate and a series of strata overlying the mesas and having a charge transfer outer layer on the mesas defining the electrostatically charged regions.

In a further aspect of the invention, a transfer stamp is provided for transferring semiconductor dice from a host substrate to a target substrate. The transfer stamp includes a substrate and a series of strata overlying and applied to said substrate, wherein the series of strata includes a charge transfer outer layer having selected regions electrically charged so as to hold a spatially distributed pattern of charge for a duration of time long enough to transfer semiconductor dice from a host substrate to a target substrate. The substrate includes a surface having a plurality of mesas formed thereon, the series of strata at least overlying the mesas. The charge transfer outer layer comprised of spaced apart portions disposed at the mesas.

BRIEF DESCRIPTION OF THE DRAWINGS

For clarity, the drawings herein are not necessarily to scale, and have been provided as such in order to illustrate the principles of the subject matter, not to limit the invention.

DESCRIPTION OF EMBODIMENTS

The term semiconductor die (plural: dice) includes light-emitting elements, which are any devices that emit electromagnetic radiation within a wavelength regime of interest, for example, visible, infrared or ultraviolet regime, when activated, by applying a potential difference across the device or passing a current through the device. Examples of light-emitting elements include solid-state, organic, polymer, phosphor-coated or high-flux light-emitting diodes (LEDs), micro-LEDs, laser diodes or other similar devices as would be readily understood. Without limiting the foregoing, micro-LEDs include LEDs with semiconductor die with lateral dimensions of 300 microns or smaller. The output radiation of an LED may be visible, such as red, blue or green, or invisible, such as infrared or ultraviolet. An LED may produce radiation of a spread of wavelengths or multiple discrete wavelengths. An LED may comprise a phosphorescent material such as cerium-activated yttrium-aluminum-garnet (YAG:$Ce^{3+}$) for converting all or part of its output from one wavelength to another. An LED may comprise multiple LEDs, each emitting essentially the same or different wavelengths.

While LEDs may be examples of transferable elements that may be transferred by the method of the present invention, other semiconductor dice may also be transferred, for example, integrated circuits, photovoltaic cells (for example single-junction or multijunction cells for concentrator photovoltaic applications), transistors, photodiodes, laser diodes, resistors, capacitors, and non-emitting diodes. Semiconductor dice transferred by the disclosed method may be used in electronic devices or in modules that may be incorporated in electronic devices. For example, a luminaire may comprise elements transferred by the method of the disclosed invention.

Exemplary Embodiments

Figure 1:
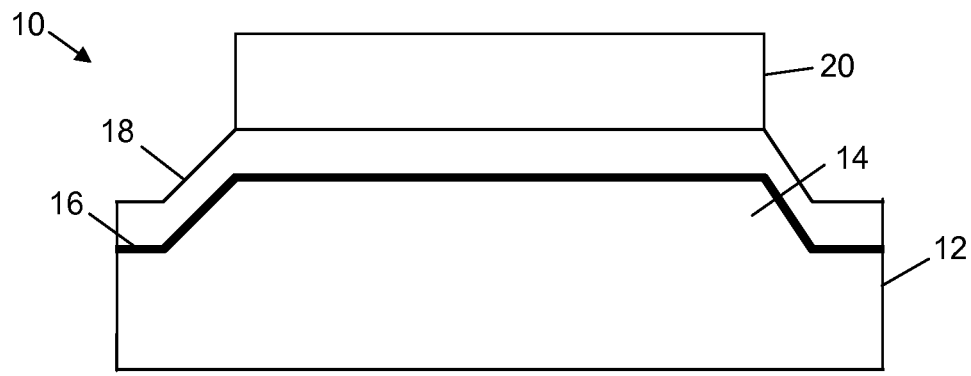
FIG. 1 is a schematic view of a portion of an electrostatic transfer stamp with a mesa.
Figure 5:
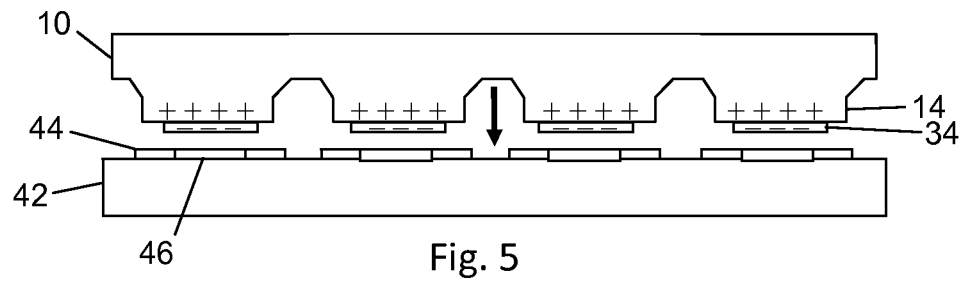
FIG. 5 is a schematic view of an electrostatic transfer stamp being brought into contact with a target substrate that is carrying adhesive and electrical interconnects.
Figure 6:
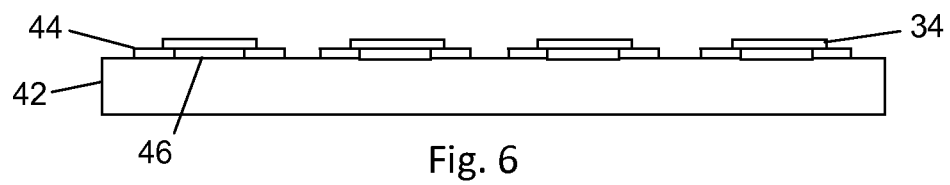
FIG. 6 is a schematic view of a target substrate mounted with semiconductor dice.
Figure 7:
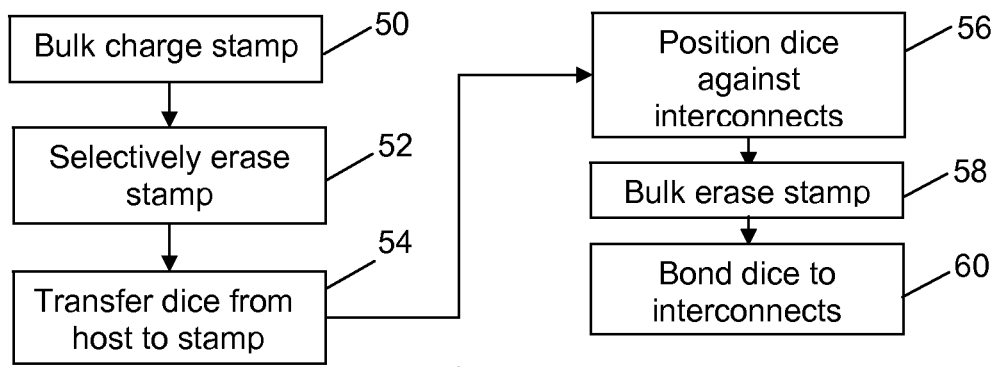
FIG. 7 is a flow diagram of a method for transferring semiconductor dice from a host substrate to a target substrate using an electrostatic transfer stamp.

Referring now to FIGS. 1-7, there is shown in FIG. 1 an electrostatic transfer stamp 10 and in FIGS. 2-6 a succession of stages in accordance with the basic steps of a method depicted in a flow diagram in FIG. 7 that uses the electrostatic transfer stamp 10 and electrostatic transfer printing techniques to transfer semiconductor dice 34 from a host substrate 32 to a target substrate 42, in accordance with the present invention. In an exemplary embodiment shown in FIG. 1, the electrostatic transfer stamp 10 includes a transparent, light-transmitting, substrate 12 with a plurality of embossed mesas 14 (only one mesas being seen in FIG. 1) spaced at selected intervals.

Additionally, the transfer stamp 10, fabricated by using known patterning techniques, has the following series of strata overlying the transparent substrate 12. A substantially transparent or translucent electrically conductive layer 16 (for example, indium-tin oxide or graphene) is conformally applied to the surface of substrate 12. A charge-generating layer 18 is then conformally applied to the transparent or translucent conductive layer 16. The layer 18 is capable of absorbing light and generating electron-hole pairs. Suitable charge-generating materials for layer 18 may include inorganic materials such as amorphous silicon, arsenic selenide, cadmium sulphide, selenium, cadmium selenide, titanium oxide, and zinc oxide, and inorganic materials such as various perylene, thiapyrrylium, anthranone, squarylium, bisazo, trisazo, and azulenium compounds, as well as organic dyes, as will be known to those skilled in the art of xerographic printing processes. A charge transfer layer 20 is then applied to the layer 18 at the top of each mesa 14 for transporting the generated charge. Suitable charge-transfer materials include various hydrazone, oxazole, triphenlymethane, arylmine, stilbene and enamine compounds. The charge generating and charge transfer layers 18, 20 may be incorporated in polymer binders, including polyester resins, polycarbonate resins, acrylic resins, and acryl-styrene resins for application to the substrate 12. Alternatively the charge generation layer 18 and charge transfer layer 20 may be the same material, such as for example amorphous selenium, selenium alloys, zinc oxide, and cadmium sulphide.

Figure 2:
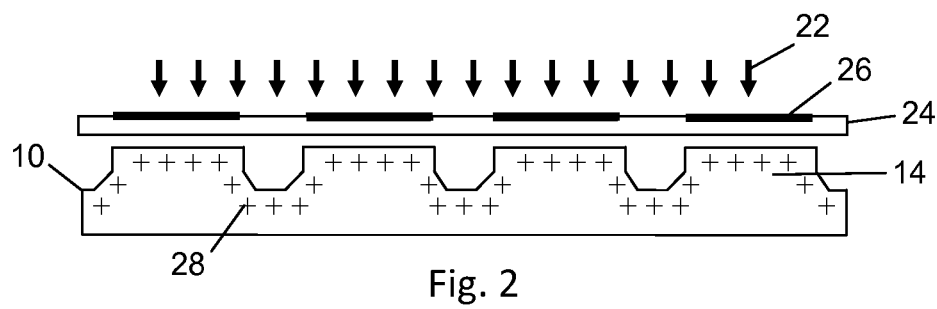
FIG. 2 is a schematic view of a charged electrostatic transfer stamp being irradiated with light through a mask.

In step 50 of the flow diagram of FIG. 7, an electrostatic charge 28 is distributed over the surface of transfer stamp 10, as shown in FIG. 2, by means of a corona discharge, a contact roller with a charge applied to it, or an ionic air curtain. This is referred to as bulk charging of the stamp 10. The polarity of the charge 28 is chosen to suit the charge generating material 20, which may be positive-charging or negative-charging.

In step 52 of the flow diagram of FIG. 7, in preparation for transfer of selected semiconductor dice 34 thereto, the non-mesa portion of the charged stamp 10 is then selectively erased of charge by exposing the stamp 10 to optical radiation 22, as shown in FIG. 2, with a wavelength range to which the charge generating material 18 is sensitive. An optical mask 24 with opaque regions 26 is employed to overlie and shield the mesas 14 from having their charge dissipated. As a result of selectively erasing the charge 28, the electrostatic transfer stamp 10, as shown inverted in FIG. 3 compared to FIG. 2, in accordance with the present invention now carries partial charge 30 on the mesas 14, i.e. in the regions where it is desired to pick up semiconductor dice 34.

Figure 3:
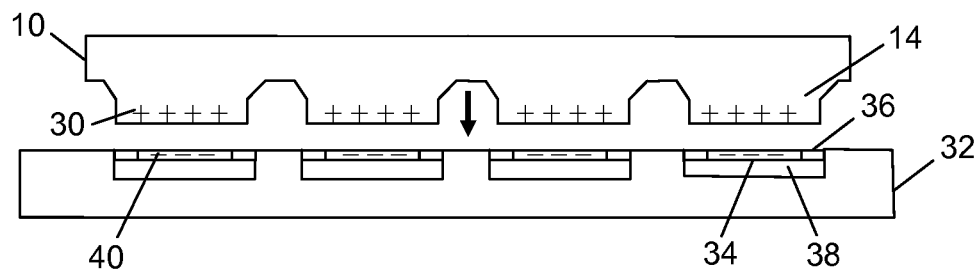
FIG. 3 is a schematic view of a selectively charged electrostatic transfer stamp being brought into proximity to a substrate carrying under-etched semiconductor dice.

Still referring to FIG. 3, the host epiwafer or substrate 32 is shown carrying release-etched semiconductor dice 34 that are suspended by small anchors 36 over gaps 38. Each die is coated with a dielectric material such as for example SU-8 photoresist (MicroChem Corporation, Newton, Mass.). An electrical charge 40 opposite to the charge 30 of the charged transfer stamp is applied to the host epiwafer 32.

Figure 4:
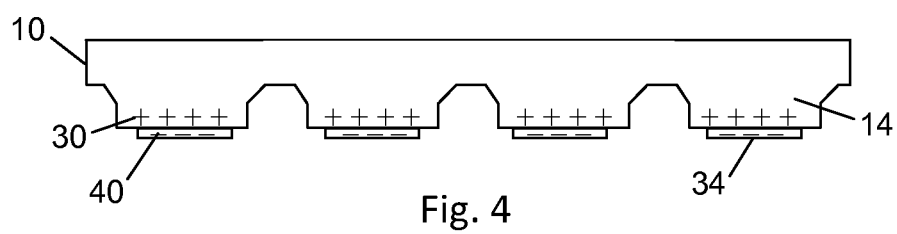
FIG. 4 is a schematic view of an electrostatic transfer stamp with semiconductor dice attached.

In step 54 of the flow diagram of FIG. 7, the transfer of the semiconductor dice 34 from the host substrate 32 to the stamp 10 occurs when the stamp 10 is then positioned such that its charged mesas 14 are brought to within a suitably close distance (typically on the order of microns) from one or more semiconductor dice 34, as also shown in FIG. 3. The transfer stamp 10 may in other embodiments be brought into contact with the semiconductor dice 34. Suitable positioning means include linear and piezoelectric motors actuating a support for the transfer stamp 10. The separation between the charge transfer layers 20 and the semiconductor dice 34 and the quantities of the electric charges 30, 40 are such that, in accordance with Coulomb's Law, the electrostatic force between the mesas 14 of the transfer stamp 10 and the semiconductor dice 34 is sufficient to fracture the anchors 36 connecting the semiconductor dice 34 to the epiwafer substrate 32 and transfer the semiconductor dice 34 to the top of the mesas. As shown in FIG. 4, the semiconductor dice 34 have been transferred to mesas 14 of the transfer stamp 10.

Referring to FIG. 5, the target substrate 42 to which will be transferred the semiconductor dice 34 on the mesas 14 of the transfer stamp 10 includes an insulating material (such as for example glass, polyethylene terephthalate (PET) or polymethyl methacrylate (PMMA)) upon which solder-coated conductive interconnects 44 and an adhesive material 46 between the interconnects 44 have been deposited.

In step 56 of the flow diagram of FIG. 7, the transfer stamp 10 is positioned, as shown in FIG. 5, such that its semiconductor dice 34 may be brought into physical contact with the interconnects 44 of a target substrate 42 and adhesively bonded to the target substrate 42. As may be appreciated by those skilled in the art, semiconductor dice 34 may comprise other microelectronic components, including but not limited to resistors, capacitors, inductors, diodes, transistors, and integrated circuits.

If, once the semiconductor dice 34 are brought into physical contact with the interconnects 44 and adhesively bonded to the target substrate 42, the adhesive force between the semiconductor dice 34 and the target substrate 42 is high enough, then the transfer stamp 10 may be separated from the target substrate 42 without dissipation of the charge. However, if the adhesive force bonding the semiconductor dice 34 to the substrate 42 is less than the electrostatic force binding the dice 34 to the transfer stamp 10, in step 58 of the flow diagram of FIG. 7 the transfer stamp 10 may then be optionally bulk erased by exposing it to optical radiation with a wavelength range to which the charge generating material 18 is sensitive. The electrical charge on the mesas 14 will as a result be dissipated, resulting in a reduction of the electrostatic force and in the semiconductor dice 34 being adhesively bonded to the target substrate 42.

There may be some natural dissipation of the electrical charges 30, 40, but the materials in the charge generating layer 18 and/or the charge transfer layer 20 are chosen to hold the charge for long enough to effect the transfer of semiconductor dice 34 from the host substrate 32 to the target substrate 42.

Finally, in step 60 of the flow diagram of FIG. 7 the semiconductor dice 42 are electrically bonded to their solder-coated interconnects 44 for example by using a suitable heat source, such as for example an infrared or laser light source, or by conductively or convectively heating the substrate 42. As a result, as shown in FIG. 6, the target substrate 42 is mounted with semiconductor dice 34, that are attached to it with adhesive 46 and electrically connected to interconnects 44 thereon.

Alternative Embodiments of Method and/or Transfer Stamp

In a first alternative embodiment, semiconductor dice 34 are removed from their host epiwafer substrate 32 by means of laser liftoff techniques rather than by fracturing the anchors 36.

In a second alternative embodiment, semiconductor dice 34 are connected to their host epiwafer substrate 32 by anchors 36 that are preferentially resistant to fracturing, dependent on the distribution of electrostatic force applied thereto. The distribution of electrostatic charge applied to charge transfer layer 20 may then be selected such that only semiconductor dice 34 with a specific orientation may be successfully removed by fracturing of their anchors 36.

In a third alternative embodiment, the mask 24 may, in addition to exposing the inter-mesa regions of the transfer stamp 10, optionally expose charge transfer layers 20 on selected mesas 14 in a preselected pattern to effect the erasure of their charge as well. In a preferred embodiment as an example, the mask 24 may shield only the mesas 14 that are located in a rectangular array at every $m^{th}$ row and $n^{th}$ column of a square array of mesas. A square array of semiconductor dice 34 on a host epiwafer substrate 32, which may for example have a center-to-center spacing of 100 microns, may then be repetitively transferred to multiple target substrates 42 with a resulting center-to-center spacing of m×100 microns in one direction and n×100 microns in the orthogonal direction.

In a fourth alternative embodiment, substrate 12 of the transfer stamp 10 is planar, without mesas 14, and transfer of semiconductor dice 34 from their host epiwafer substrate 32 to the transfer stamp 10 is effected by means of electrically charging selected regions of charge transfer layer 20.

In a fifth embodiment, the target substrate includes mesas upon which semiconductor dice 34 are deposited using the substantially planar transfer stamp of the previous alternative embodiment.

In a sixth alternative embodiment, erasure of the electrostatic charge 30 from charge transfer layer 20 is effected by selective activation of a mechanically or electrically scanned LED array or laser scanner, as will be known to those skilled in the art of xerographic printing processes.

In a seventh alternative embodiment, the charge transfer layer 20 is selectively discharged by the localized application of conducted thermal energy or ionized air.

In an eighth alternative embodiment, the anchors 36 connecting semiconductor dice 34 to their host epiwafer substrate 32 are broken by mechanical means (including one or more of the application of constant or varying force upon the transfer stamp 10, ultrasonic vibration of the transfer stamp 10 or host epiwafer 32, and shock waves or supersonic shock waves propagated through the transfer stamp by means of ultrasonic transducers) while the dice are simultaneously held in place for transfer by electrostatic forces.

In a ninth alternative embodiment, semiconductor dice 34 are transferred to a target substrate 32 without an adhesive coating on the target substrate, wherein the dice are electrically bonded to the interconnects 44 before the transfer stamp 10 is removed.

In a tenth alternative embodiment, the mesas 14 are coated with an electret material possessing a quasi-permanent dipole polarization. Suitable materials include waxes, polymers, and resins that are melted and then cooled to solidification in a static electric field, and ferroelectric materials. The electret materials provide a permanent electric field.

Figure 8:
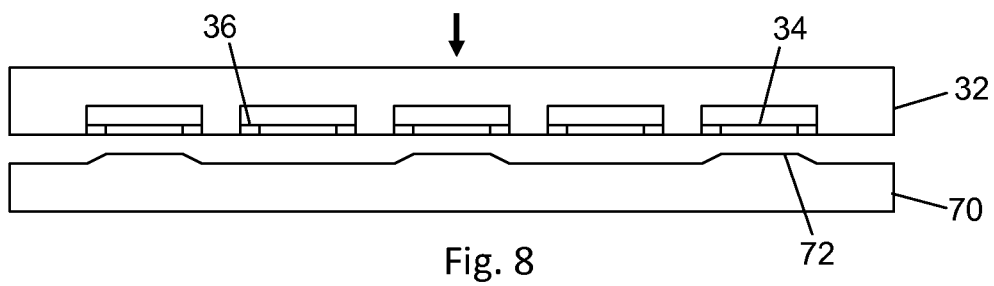
FIG. 8 is a schematic view of a host substrate being brought into contact with a target substrate.
Figure 9:
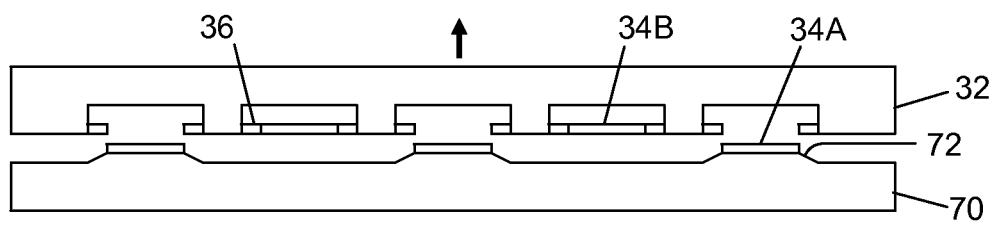
FIG. 9 is a schematic view of a host substrate removed from a target substrate, having transferred semiconductor dice thereto.

In an eleventh alternative embodiment, the semiconductor dice 34 are directly transferred from the host substrate 32 to a target substrate 70 as indicated in FIGS. 8 and 9. Semiconductor dice 34 are attached to host substrate 32 by anchors 36. The target substrate 70 with electrostatically charged mesas 72 is brought into contact with host substrate 32, whereupon selected semiconductor dice 34A are detached from anchors 36 and transferred to mesas 72 when the host substrate 32 and target substrate 70 are separated. The semiconductor dice 34B that are not selected remain attached to the host substrate 32.

In a twelfth alternative embodiment, the host substrate 32 may not be directly charged, and charges in the semiconductor dice may be induced as the charged transfer stamp 10 is brought into proximity with the host substrate 32.

In the description herein, embodiments disclosing specific details have been set forth in order to provide a thorough understanding of the invention, and not to provide limitation. However, it will be clear to one having skill in the art that other embodiments according to the present teachings are possible that are within the scope of the invention disclosed, for example the features described above may be combined in various different ways to form multiple variations of the invention.

What is claimed is:

1. A method for transferring semiconductor dice from a host substrate to a target substrate, comprising the steps of:
electrostatically charging regions of a selected one of a transfer stamp or a target substrate;
transferring semiconductor dice from a host substrate to said electrostatically charged regions of the selected one of the transfer stamp or target substrate by the application of the electrostatic force of the charged regions to the semiconductor dice when the host substrate is positioned adjacent to the selected one of the transfer stamp or target substrate; and releasing the semiconductor dice onto the target substrate from the transfer stamp, when the selected one is the transfer stamp, by at least removing the electrostatic charge of the electrostatically charged regions or providing an adhesive force between the semiconductor dice and the target substrate that is greater than the electrostatic force between the semiconductor dice and the electrostatically charged regions, wherein electrostatically charging regions of the selected one of the transfer stamp or the target substrate comprises (i) bulk electrostatic charging the transfer stamp or the target substrate and (ii) thereafter, erasing charge therefrom by exposing the selected one of the transfer stamp or the target substrate to optical radiation through an optical mask with opaque portions overlying and shielding the electrostatically charged regions from having their charge dissipated by the optical radiation.

2. The method of claim 1 wherein the selected one of the transfer substrate or target substrate has spaced apart mesas formed thereon and defining the electrostatically charged regions.

3. A method for transferring semiconductor dice from a host substrate to a target substrate, comprising the steps of:

electrostatically charging regions of a transfer stamp by a process comprising (i) bulk electrostatic charging of the transfer stamp and (ii) thereafter, erasing charge from the transfer stamp by exposing the transfer stamp to optical radiation through an optical mask with opaque portions overlying and shielding the electrostatically charged regions from having their charge dissipated by the optical radiation;

removing semiconductor dice from a host substrate using the electrostatically charged regions of the transfer stamp; and releasing the semiconductor dice from the transfer stamp onto the target substrate by at least removing the electrostatic charge of the stamp or providing an adhesive force between the semiconductor dice and the target substrate that is greater than the electrostatic force between the semiconductor dice and the transfer stamp.

4. The method of claim 3 wherein the transfer stamp has spaced apart mesas formed on a light-transmitting substrate and a series of strata overlying the mesas and having a charge transfer outer layer on the mesas defining the electrostatically charged regions.

5. The method of claim 3 wherein said removing the semiconductor dice from the host substrate to the transfer stamp occurs when the transfer stamp is positioned such that the electrostatically charged regions are placed adjacent to the semiconductor dice.

6. The method of claim 1 wherein the transfer stamp has spaced apart mesas formed on a substrate and a series of strata overlying the mesas and having a charge transfer outer layer on the mesas defining the electrostatically charged regions.

7. The method of claim 6 wherein said removing the semiconductor dice from the host substrate to the transfer stamp occurs when the transfer stamp is positioned such that the electrostatically charged regions on the mesas are placed adjacent to the semiconductor dice.

* * * * *